(12) United States Patent
Freidl et al.

(10) Patent No.: US 10,673,442 B2
(45) Date of Patent: Jun. 2, 2020

(54) TESTING PROPERTIES OF A VOLTAGE-CONTROLLED OSCILLATOR

(71) Applicant: Infineon Technologies AG, Neubiberg (DE)

(72) Inventors: Philipp Franz Freidl, Graz (AT); Fabio Padovan, Villach (AT); Mattias Welponer, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/203,857

(22) Filed: Nov. 29, 2018

(65) Prior Publication Data

US 2019/0190524 A1  Jun. 20, 2019

(30) Foreign Application Priority Data

Dec. 18, 2017 (DE) .......................... 10 2017 130 390

(51) Int. Cl.
*H03L 7/093* (2006.01)
*H03L 7/099* (2006.01)
(Continued)

(52) U.S. Cl.
CPC ............ *H03L 7/0995* (2013.01); *H03L 7/093* (2013.01); *H03L 7/099* (2013.01); *H03L 7/145* (2013.01);
(Continued)

(58) Field of Classification Search
CPC .... H03B 2200/009; H03L 7/085; H03L 7/093
See application file for complete search history.

(56) References Cited

U.S. PATENT DOCUMENTS 5,036,291 A * 7/1991 Marz .................. H03D 3/241
329/325
5,608,354 A * 3/1997 Hori .................. H03L 7/085
327/107
(Continued)

FOREIGN PATENT DOCUMENTS

CN        105842604     8/2016
DE     102012021239    4/2014

OTHER PUBLICATIONS

Tom A.D. Riley et al., "Delta-Sigma Modulation in Fractional-N Frequency Synthesis", in: IEEE Journal of Solid-State Circuits, vol. 28, No. 5, May 1993, 7 pages.

*Primary Examiner* — Levi Gannon
(74) *Attorney, Agent, or Firm* — Harrity & Harrity, LLP

(57) ABSTRACT

An integrated circuit is described herein. In accordance with one embodiment, the circuit includes a voltage controlled oscillator (VCO) that is configured to receive a tuning voltage at a tuning input and to provide an RF oscillator signal at an oscillator output. The circuit further includes a first and a second switchable resistor network. The first switchable resistor network includes at least a first resistor and at least a first switch and is connected between the tuning input of the VCO and a first node, which operably provides a first voltage. The second switchable resistor network includes at least a second resistor and at least a second switch and is connected between the tuning input of the VCO and a second node, which operably provides a second voltage. Furthermore, the circuit includes a control circuit that is configured to activate, dependent on a control signal, either the first switchable resistor network, the second switchable resistor network or both, the first and the second resistor networks.

20 Claims, 5 Drawing Sheets

(51) Int. Cl.
*H03L 7/14* (2006.01)
*H03L 7/189* (2006.01)
*H03L 7/197* (2006.01)

(52) U.S. Cl.
CPC ............ *H03L 7/189* (2013.01); *H03L 7/1976* (2013.01); *H03B 2200/009* (2013.01)

(56) References Cited

U.S. PATENT DOCUMENTS

| | | | |
|---|---|---|---|
| 7,265,633 B1 | 9/2007 | Stiff | |
| 8,558,592 B2* | 10/2013 | Sreekiran | H03L 7/0893 327/157 |
| 8,558,728 B1* | 10/2013 | Lemkin | G01R 31/31709 341/166 |
| 10,141,943 B1* | 11/2018 | Williams | H03L 7/1075 |
| 2007/0201594 A1* | 8/2007 | Fujiwara | H03L 7/085 375/376 |
| 2008/0100352 A1* | 5/2008 | Park | H03L 7/0896 327/156 |
| 2009/0315628 A1* | 12/2009 | Mori | H03L 1/00 331/10 |
| 2014/0070856 A1* | 3/2014 | Ainspan | H03L 7/087 327/145 |
| 2016/0164405 A1* | 6/2016 | Ravinuthula | H03L 7/085 327/157 |
| 2018/0212611 A1* | 7/2018 | Shen | H03L 7/095 |

\* cited by examiner

TESTING PROPERTIES OF A VOLTAGE-CONTROLLED OSCILLATOR

RELATED APPLICATION

This application claims priority under 35 U.S.C. § 119 to German Patent Application No. 102017130390.1, filed on Dec. 18, 2017, the contents of which are incorporated by reference herein in their entirety.

TECHNICAL FIELD

The present disclosure relates to the field of integrated voltage controlled oscillators (VCO), particularly to devices having specific features that allow the testing of a voltage controlled oscillator.

BACKGROUND

Modern radio-frequency (RF) devices such as radar range and velocity sensors or wireless communication devices can be integrated in integrated circuits (ICs, e.g. monolithic microwave integrated circuits, MMICs).

Such ICs may incorporate all core functions of an RF frontend (e.g. local oscillator, power amplifiers, low-noise amplifiers (LNA), mixers, etc.), the analog preprocessing of the intermediate frequency (IF) or base band signals (e.g. filters, amplifiers, etc.), and the analog-to-digital conversion in one single package.

Exemplary applications of such integrated circuits are frequency-modulated continuous-wave (FMCW) radar systems that make use of RF signals whose frequency is modulated by ramping the signal frequency up and down. Such RF signals are often referred to as "chirp signals" or simply as chirps, wherein frequency is ramped up in an up-chirp and ramped down in a down-chirp. For generating such chirp signals the radar transmitter may include a local oscillator (LO), which includes a voltage-controlled oscillator (VCO) connected in a phase-locked loop (PLL).

The quality of the LO signal may affect the quality and/or reliability of the IC's operation. For some applications, the VCO included in an IC may be tested, for example during an end-of-line (EOL) test during production or regularly during operation of the IC. The power of the phase noise of a VCO is one quality parameter that affects the signal-to-noise ratio of the generated RF signals. In order to be able to test parameters like the phase noise power generated by an integrated VCO an IC may include specific circuits, circuit components or other features that enable the testing of the VCO in order to check whether the VCO can operate in accordance with desired specifications.

SUMMARY

An integrated circuit is described herein. In accordance with one embodiment, the circuit includes a voltage controlled oscillator (VCO) that is configured to receive a tuning voltage at a tuning input and to provide an RF oscillator signal at an oscillator output. The circuit further includes a first and a second switchable resistor network. The first switchable resistor network includes at least a first resistor and at least a first switch and is connected between the tuning input of the VCO and a first node, which operably provides a first voltage. The second switchable resistor network includes at least a second resistor and at least a second switch and is connected between the tuning input of the VCO and a second node, which operably provides a second voltage. Furthermore, the circuit includes a control circuit that is configured to activate, dependent on a control signal, either the first switchable resistor network, the second switchable resistor network or both, the first and the second resistor networks.

Furthermore, a method for testing an integrated circuit is described herein. In accordance with one embodiment, the method includes receiving a control signal by the integrated circuit and from an automatic test equipment (ATE), wherein the integrated circuit includes a voltage controlled oscillator (VCO) that is configured to receive a tuning voltage at a tuning input. The method further includes selectively activating or deactivating a first switchable resistor network or a second switchable resistor network, or both, dependent on the control signal received from the ATE, wherein the first switchable resistor network includes at least a first resistor and at least a first switch and is connected between the tuning input of the VCO and a first node, which provides a first voltage. The second switchable resistor network includes at least a second resistor and at least a second switch and is connected between the tuning input of the VCO and a second node, which provides a second voltage.

Moreover, a system is described herein that, in accordance with one embodiment, includes an ATE, which has a communication interface and at least one test signal input, and an integrated circuit, which includes a communication interface coupled to the communication interface of the ATE to receive a control signal from the ATE. The integrated circuit further includes an external contact that is connected with the test signal input of the ATE as well as a VCO configured to receive a tuning voltage at a tuning input and to provide an RF oscillator signal at an oscillator output. The oscillator output is coupled with the external contact. The integrated circuit further includes a first and a second switchable resistor network. The first switchable resistor network includes at least a first resistor and at least a first switch and is connected between the tuning input of the VCO and a first node operably providing a first voltage. The second switchable resistor network includes at least a second resistor and at least a second switch and is connected between the tuning input of the VCO and a second node operably providing a second voltage. Moreover, the integrated circuit includes a control circuit that is configured to activate, dependent on the control signal received by the digital communication interface of the integrated circuit, either the first switchable resistor network, the second switchable resistor network or both, the first and the second resistor networks.

BRIEF DESCRIPTION OF THE DRAWINGS

The implementations, described herein, can be better understood with reference to the following drawings and descriptions. The components in the figures are not necessarily to scale; instead emphasis is placed upon illustrating the principles of the implementations described herein. Moreover, in the figures, like reference numerals designate corresponding parts. In the drawings.

DETAILED DESCRIPTION

Embodiments are discussed below in the context of a radar transceiver. It should be noted, however, that the embodiments may also be applied in applications different from radar such as, for example, RF transceivers of RF communication devices. In fact, almost any RF circuitry includes a local oscillator for generating an RF signal.

Figure 1:
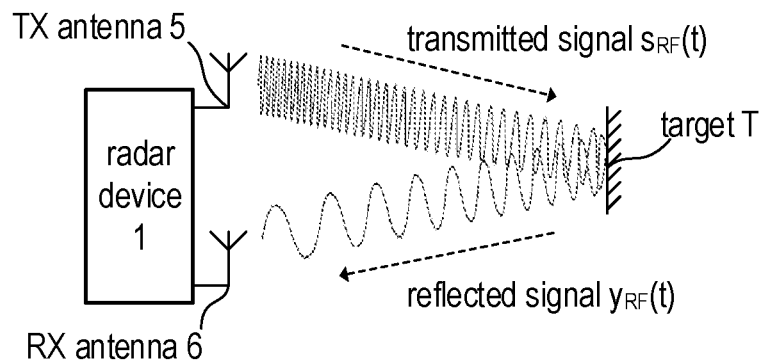
FIG. 1 is a diagram illustrating the operating principle of an FMCW radar system for distance and/or velocity measurement.

FIG. 1 illustrates a conventional frequency-modulated continuous-wave (FMCW) radar system 1. In the present example, separate transmission (TX) and reception (RX) antennas 5 and 6, respectively, are used. However, it is noted that a single antenna can be used so that the transmission antenna and the reception antenna are physically the same (monostatic radar configuration). The transmission antenna continuously radiates an RF signal $s_{RF}(t)$, which is frequency-modulated, for example, by a periodic linear frequency ramp signal (also referred to as frequency sweep or chirp signal). The transmitted signal $s_{RF}(t)$ is back-scattered at a target T, which is located in the radar channel within the measurement range of the radar device. The back-scattered signal $y_{RF}(t)$ is received by the reception antenna 6. In the depicted example, the back-scattered signal is denoted as $y_{RF}(t)$.

Figure 2:
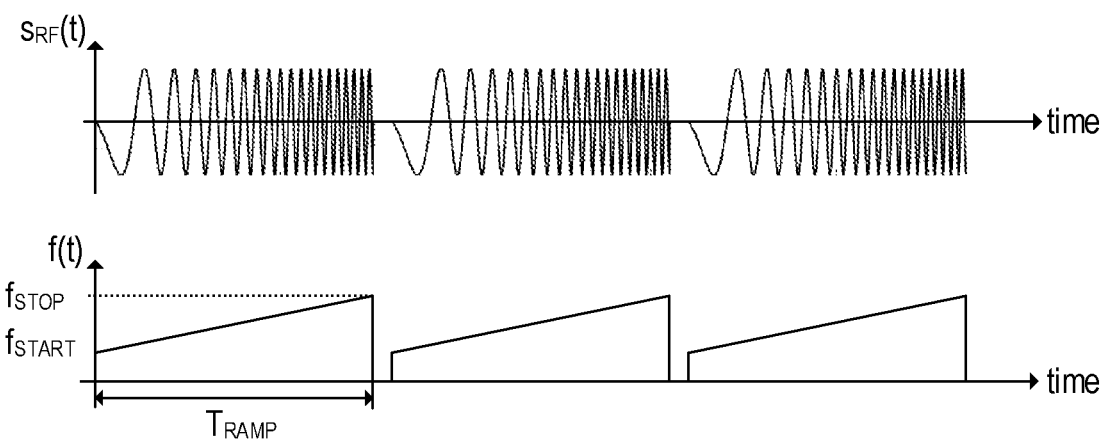
FIG. 2 includes two timing diagrams illustrating the frequency modulation of the RF signal used in FMCW radar systems.

FIG. 2 illustrates the mentioned frequency-modulation of the signal $s_{RF}(t)$. As shown in the first diagram of FIG. 2, the signal $s_{RF}(t)$ may be composed of a series of "chirps", i.e. a sinusoidal waveform with increasing (up-chirp) or decreasing (down-chirp). In the present example, the instantaneous frequency f(t) of a chirp increases linearly from a start frequency $f_{START}$ to a stop frequency $f_{STOP}$ within a defined time span $T_{RAMP}$ (see second diagram of FIG. 2). Such a chirp is also referred to as a linear frequency ramp. Three identical linear frequency ramps are illustrated in FIG. 2. It is noted, however, that the parameters $f_{START}$, $f_{STOP}$, $T_{RAMP}$ as well as the pause between the individual frequency ramps may vary dependent on the actual implementation and use of the radar device 1. In practice, the frequency variation may be, for example, linear (linear chirp, frequency ramp), exponential (exponential chirp) or hyperbolic (hyperbolic chirp).

Figure 3:
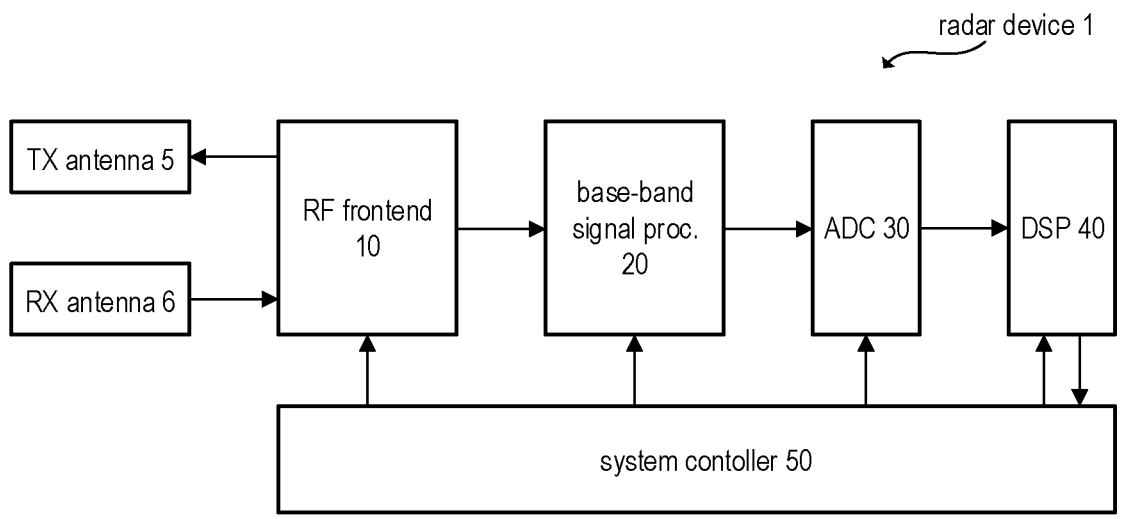
FIG. 3 is a block diagram illustrating the basic structure of an FMCW radar device.

FIG. 3 is a block diagram that illustrates an example structure of a radar device 1 (radar sensor). It is noted that a similar structure may also be found in RF transceivers used in other applications such as, for example, in wireless communications systems. Accordingly, at least one transmission antenna 5 (TX antenna) and at least one reception antenna 6 (RX antenna) are connected to an RF frontend 10, which may be integrated in a monolithic microwave integrated circuit (MIMIC). The RF frontend 10 may include all the circuit components needed for RF signal processing. Such circuit components may (but not necessarily need to) include, for example, a local oscillator (LO), RF power amplifiers, low noise amplifiers (LNAs), directional couplers such as rat-race-couplers and circulators, and mixers for the down-conversion of RF signals (e.g. the received signal $y_{RF}(t)$, see FIG. 1) into the base-band or an intermediate frequency (IF) band. It is noted that antenna-arrays may be used instead of single antennas. The depicted example shows a bistatic (or pseudo-monostatic) radar system, which has separate RX and TX antennas. In case of a monostatic radar system, a single antenna or a single antenna array may be used for both, receiving and transmitting electromagnetic (radar) signals. In this case a directional coupler (e.g. a circulator) may be used to separate RF signals to be transmitted to the radar channel from RF signals received from the radar channel. In practice, radar systems often include several transmission (TX) and reception (RX) channels, which amongst others allows the measurement of the direction (DoA, direction of arrival), from which the radar echoes are received.

In case of a frequency-modulated continuous-wave (FMCW) radar system, the transmitted RF signals radiated by the TX antenna 5 are in the range between approximately 20 GHz (e.g. 24 GHz) and 100 GHz (e.g. 77 GHz in automotive applications). As mentioned, the RF signal $y_{RF}(t)$ received by the RX antenna 6 includes the radar echoes, i.e. the signal back-scattered at the so-called radar targets. The received RF signals $y_{RF}(t)$ are down-converted into the base band (or IF band) and further processed in the base band using analog signal processing (see FIG. 3, base-band signal processing chain 20), which basically includes filtering and amplification of the base-band signal. The base-band signal is finally digitized using one or more analog-to-digital converters 30 and further processed in the digital domain (see FIG. 3, digital signal processing chain implemented, e.g., in digital signal processor 40). The overall system is controlled by a system controller 50, which may be at least partly implemented using a processor such as a microcontroller executing appropriate firmware. The RF frontend 10 and the analog base-band signal processing chain 20 (and optionally the ADC 30) may be integrated in a single MIMIC. However, the components may be distributed among two or more integrated circuits.

Figure 4:
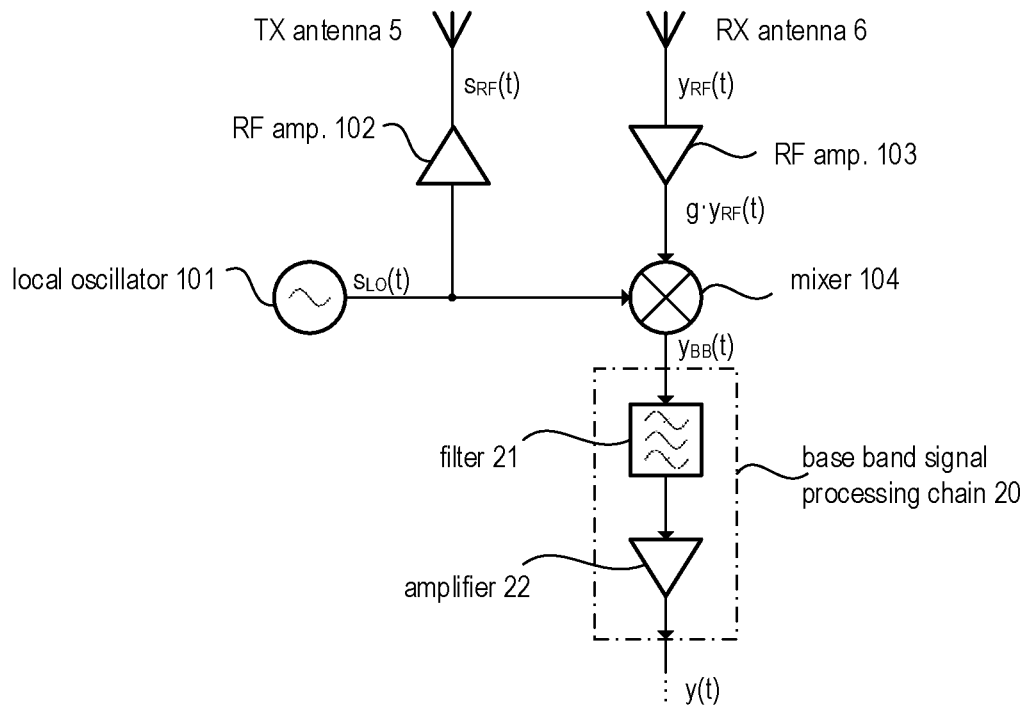
FIG. 4 is a circuit diagram illustrating one example of an analog RF frontend, which may be included in the FMCW radar device of FIG. 3.

FIG. 4 illustrated one example implementation of the RF frontend 10, which may be included in the radar sensor shown in FIG. 3. It is noted that FIG. 4 is a simplified circuit diagram illustrating the basic structure of an RF frontend. Actual implementations, which may heavily depend on the application, are of course more complex and include several RX and/or TX channels. The RF frontend 10 includes a local oscillator 101 (LO) that generates a RF signal $s_{LO}(t)$, which may be frequency-modulated as explained above with reference to FIG. 2. The signal $s_{LO}(t)$ is also referred to as LO signal. In radar applications, the LO signal is usually in the SHF (Super High Frequency) or the EHF (Extremely High Frequency) band, e.g. between 76 GHz and 81 GHz in automotive applications.

The LO signal $s_{LO}(t)$ is processed in the transmit signal path as well as in the receive signal path. The transmission signal $s_{RF}(t)$ (outgoing radar signal), which is radiated by the TX antenna 5, is generated by amplifying the LO signal $s_{LO}(t)$, e.g., using an RF power amplifier 102. The output of the amplifier 102 is coupled to the TX antenna 5. The received signal $y_{RF}(t)$ (incoming radar signal), which is provided by the RX antenna 6, is directed to a mixer 104. In the present example, the received signal $y_{RF}(t)$ (i.e. the antenna signal) is pre-amplified by RF amplifier 103 (gain g), so that the mixer receives the amplified signal $g \cdot y_{RF}(t)$ at its RF input port. The mixer 104 further receives the LO signal $s_{LO}(t)$ at its reference input port and is configured to down-convert the amplified signal $g \cdot y_{RF}(t)$ into the base band. The resulting base-band signal at the mixer output is denoted as $y_{BB}(t)$. The base-band signal $y_{BB}(t)$ is further processed by the analog base band signal processing chain 20 (see also FIG. 3), which basically includes one or more filters (e.g. a band-pass 21) to remove undesired side bands and image frequencies as well as one or more amplifiers such as amplifier 22). The analog output signal, which may be supplied to an analog-to-digital converter (cf. FIG. 3) is denoted as y(t). Various techniques for the digital post-processing of the digitized output signals (digital radar signal) are as such known (e.g. Range Doppler Analysis) and thus not further explained herein.

In the present example, the mixer 104 down-converts the RF signal $g \cdot y_{RF}(t)$ (amplified antenna signal) into the base band. The respective base band signal (mixer output signal) is denoted by $y_{BB}(t)$. The down-conversion may be accomplished in a single stage (i.e. from the RF band into the base band) or via one or more intermediate stages (from the RF band into an IF band and subsequently into the base band). In view of the example of FIG. 4, it is clear that the quality of the radar measurement will heavily depend on the quality of the LO signal $s_{LO}(t)$. Low phase noise and steep and highly linear frequency ramps are desired properties of the LO signal $s_{LO}(t)$.

Figure 5:
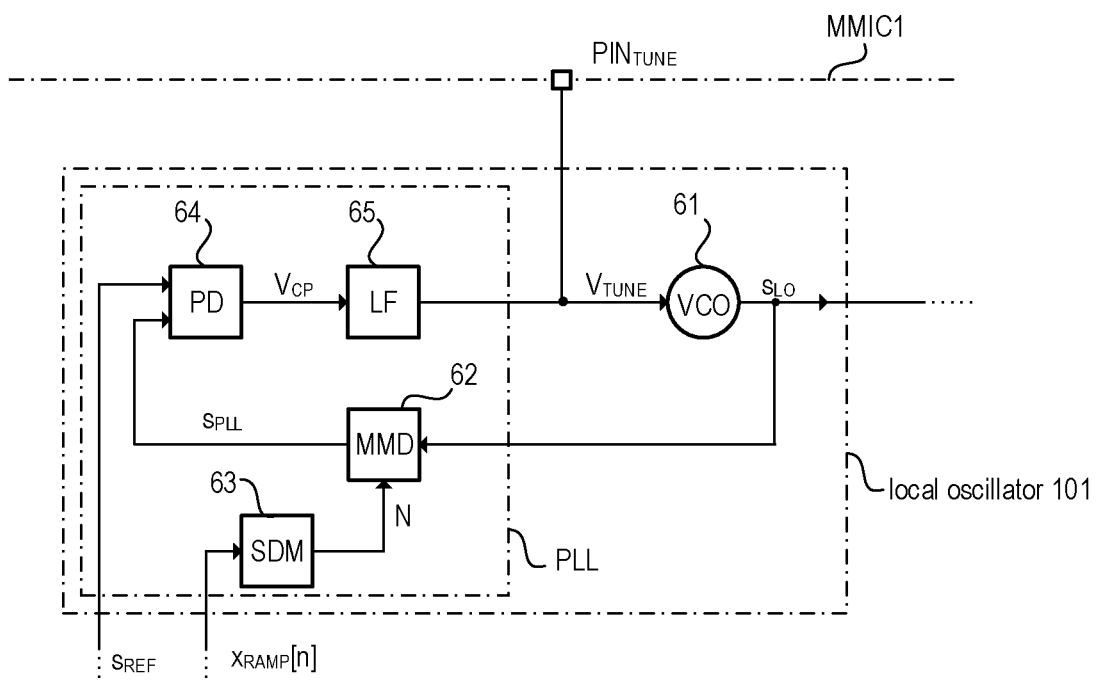
FIG. 5 is a block diagram illustrating one example of a local oscillator, which may be included in the RF frontend of FIG. 4 to generate frequency-modulated RF signals.

FIG. 5 illustrates one example implementation of a local oscillator, such as the LO 101 in FIG. 4. The present example is a simplified circuit diagram illustrating the basic structure of an RF oscillator that includes a voltage-controlled oscillator (VCO) connected in a phase-locked loop (PLL). A VCO is an electronic oscillator whose oscillation frequency is controlled by a voltage signal $V_{TUNE}$ (control signal). The voltage applied at the control input of the VCO determines the instantaneous oscillation frequency. Consequently, the frequency of the VCO output signal (i.e. the LO signal $s_{LO}(t)$) can be modulated by appropriately modulating the control signal $v_{TUNE}(t)$, which is accomplished by the feedback loop of the PLL.

As shown in the example of FIG. 5, the feedback loop of the PLL may include a fractional-N multi-modulus frequency divider. Such a fractional-N multi-modulus frequency divider may be composed of a multi-modulus divider (MMD) 62 and a Σ-Δ modulator (SDM) 63, which is configured to continuously alter the (integer) frequency division ratio N, so as to accomplish a rational number as effective frequency division ratio. The basic principle of such a PLL is as such known and described, e.g., in Tom A. D. Riley: *Delta-Sigma Modulation in Fractional-N Frequency Synthesis*, in: *IEEE Journal of Solid-State Circuits*, vol. 28, no. 5, May 1993.

According to the example of FIG. 5, the PLL includes a VCO 61 which generates the LO signal $s_{LO}(t)$ as output signal. The frequency of the LO signal $s_{LO}(t)$ is denoted as $f_{LO}$ and is set in accordance with the signal $v_{TUNE}(t)$ applied at the control input of the VCO 61. The LO signal $s_{LO}(t)$ is supplied to MMD 62, which has a selectable (integer) division ratio N. That is, MMD 62 is configured to reduce the frequency supplied to its input by a factor N and to generate a divider output signal $s_{PLL}(t)$ having a frequency denoted as $f_{PLL}$, wherein $f_{LO} = N \cdot f_{PLL}$. The division ratio N is selectable dependent on a signal supplied to a select input of MMD 62. The output signal $s_{PLL}(t)$ (frequency $f_{PLL}$) of MMD 62 is also referred to as PLL clock signal. In a radar application the RF oscillator frequency $f_{LO}$ may be, e.g., between 76 GHz and 81 GHz, while the PLL clock signal $s_{PLL}(t)$ may have a PLL clock frequency $f_{PLL}$ in a range from 160 MHz to 200 MHz. Instead of directly supplying the LO signal $s_{LO}(t)$ to MMD 62, it may be pre-divided by a constant division ratio.

The frequency divider output signal $s_{PLL}(t)$ as well as a reference signal $s_{REF}(t)$, which may have a constant frequency denoted as $f_{REF}$, are supplied to a phase detector (PD) 64 (also known as phase comparator). Dependent on the implementation a phase-frequency-detector (PFD) may be employed instead. Phase detectors as well as phase-frequency detectors are commonly used in the field of PLLs and therefore not further discussed in more detail. The reference signal $s_{REF}(t)$ may be generated by a reference oscillator or generated based on the signal of a reference oscillator (e.g. a quartz oscillator), e.g. by frequency division or frequency multiplication (see also FIG. 7, quartz oscillator 70).

The output signal $v_{CP}(t)$ of PD 64 is usually generated by a charge-pump included in the output stage of the PD. The output signal $v_{CP}(t)$ may be regarded as an error signal that is filtered by a loop filter 65 (LF), which determines the band—with of the control loop. The output signal of LF 65 may be used as control signal $v_{TUNE}(t)$ to adjust the oscillation frequency $f_{LO}$ of VCO 61, thus closing the control loop. The closed loop ensures that the frequency $f_{LO}$ is continuously tuned to such a value that the phases of the divider output signal $s_{PLL}(t)$ and the reference signal $s_{REF}(t)$ match. That is, the phase is "locked". Various implementations of phase detectors and phase-frequency-detectors including charge-pumps are as such known in the art and thus not further discussed herein in more detail.

By appropriately tuning the (effectively rational) division ratio N used by the MMD 62, a frequency modulation of the LO signal $s_{LO}(t)$ may be accomplished. As mentioned above, a frequency modulation is particularly used to generate chirps or frequency ramps. For an accurate measurement the phase noise included in the LO signal $s_{LO}(t)$ and the linearity of the frequency ramps have to comply with defined specifications, which may be tested during operation (e.g. during idle times of the radar sensor) and/or in an end-of-line test (EOL test) during production of the radar devices.

Also shown in FIG. 5 is an external contact, which may be an external pin $PIN_{TUNE}$ or test pad and which allows to externally set the tuning voltage $v_{TUNE}(t)$ at the control input of the VCO 61. Supplying the tuning voltage $v_{TUNE}(t)$ via an external contact is particularly done during test such as EOL test or the like, in which the tuning voltage $v_{TUNE}(t)$ is provided, e.g., by an automatic test equipment (ATE). Such tests aim at, inter alia, characterizing the noise properties of the VCO 61 as phase noise may affect the reliability of the measurements. Phase noise, however, is not only determined by intrinsic properties of the VCO 61; also noise included in the (externally generated) tuning voltage $v_{TUNE}(t)$ will cause phase noise in the VCO output signal. To ensure, during a test, that the measured phase noise of the VCO output signal $s_{LO}(t)$ occurs substantially due to the intrinsic characteristics of the VCO, a low-noise voltage source should be used for generating the tuning voltage $v_{TUNE}(t)$. It is noted that, during such a test, the feedback loop of the PLL is inactive and the tuning voltage is only determined by the voltage applied at the external contact (e.g. pin $PIN_{TUNE}$).

Figure 6:
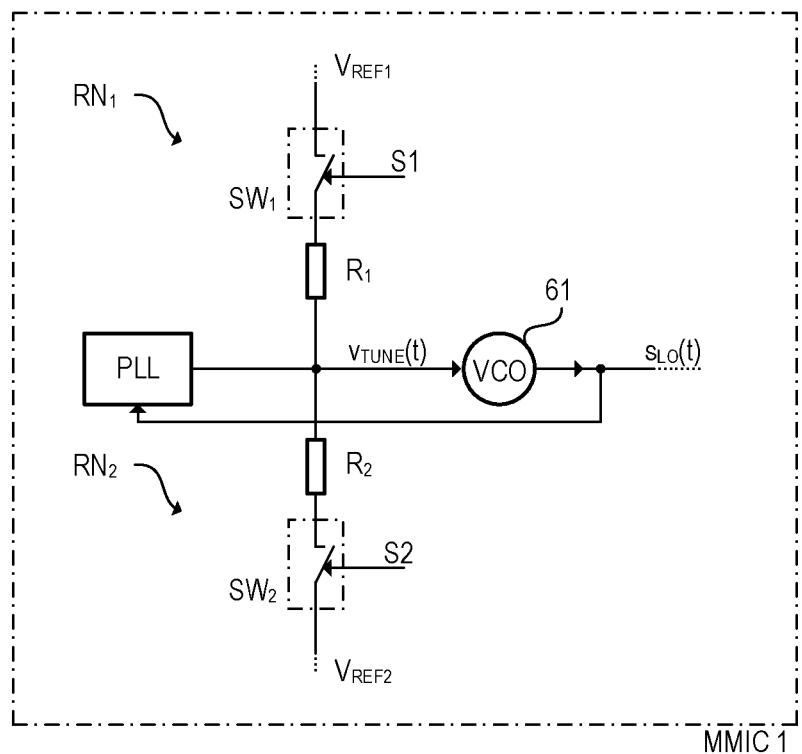
FIG. 6 is a diagram illustrating one example of a circuit which may be used to set a tuning voltage of a VCO with low noise.

FIG. 6 illustrates an example of a circuit including a VCO 61, which may be connected in a PLL during operation. In order to provide testability of the VCO characteristics (particularly its phase noise characteristics) the circuit of FIG. 6 includes circuitry for generating a low-noise tuning voltage $v_{TUNE}(t)$, which can be set to different voltage levels to test different operating points of the VCO. According to the example of FIG. 6, a MIMIC 1 includes a VCO 61, which can be regarded as device under test. As mentioned the VCO 61 is configured to receive a tuning voltage $v_{TUNE}(t)$ at a tuning input and to provide an RF oscillator signal $s_{LO}(t)$ (i.e. the LO signal) at an oscillator output. In the present example, the tuning voltage $v_{TUNE}(t)$ is not set by an external device via a test contact such as pin $PIN_{TUNE}$, but rather can be provided as voltage that is derived from internal supply voltages of the MIMIC. In the depicted example, the tuning voltage $v_{TUNE}(t)$ is provided by switchable resistor networks coupled to the tuning input of the VCO 61. Accordingly, a first switchable resistor network $RN_1$ includes at least a first resistor $R_1$ and at least a first switch $SW_1$ and is connected between the tuning input of the VCO 61 and a first circuit node. Similarly, a second switchable resistor network $RN_2$ includes at least a second resistor $R_2$ and at least a second switch $SW_2$ and is connected between the tuning input of the VCO 61 and a second circuit. During operation of the MIMIMC a first voltage $V_{REF1}$ is provided at the first circuit node and a second voltage $V_{REF2}$ is provided at the second circuit node. Moreover, the MIMIC 1 includes a control circuit 70 that is configured to activate, dependent on a control signal, either the first switchable resistor network $RN_1$, the second switchable resistor network $RN_2$ or both switchable resistor networks $RN_1$ and $RN_2$. It is to be noted that, in some embodiments, a resistor network may include only a single resistor with a switch to selectively couple the resistor.

Figure 7:
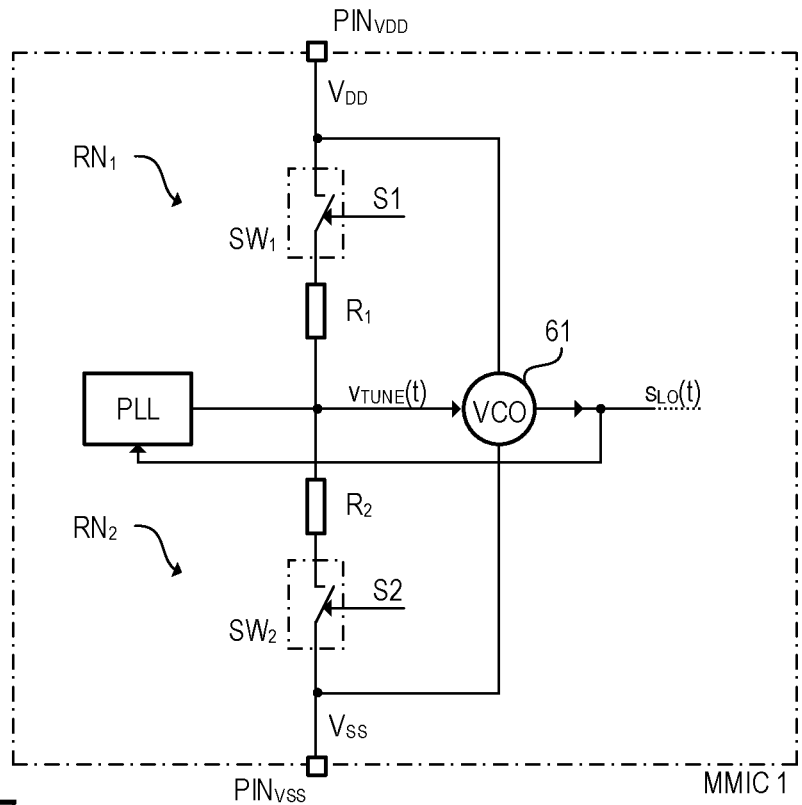
FIG. 7 illustrates an example modification of the circuit of FIG. 6.

The first circuit node and the second circuit node may be supply nodes. That is, the first voltage $V_{REF1}$ may be a first supply voltage $V_{DD}$ that is provided to the first circuit node via a first supply pin $PIN_{VDD}$. Similarly, the second voltage $V_{REF2}$ may be a second supply voltage $V_{SS}$ (e.g. 0 volts, ground potential) that is provided to the second circuit node via a second supply pin $PIN_{VSS}$. This situation is illustrated in the example of FIG. 7, in which the VCO 61 is also coupled to first and second circuit nodes and thus supplied by the supply voltages $V_{DD}$ and $V_{SS}$. Apart from the voltage supply, the examples of FIGS. 6 and 7 are identical.

In the examples of FIGS. 6 and 7, the first switchable resistor networks $RN_1$ includes a series circuit of a resistor $R_1$ and an electronic switch $SW_1$. Similarly, the second switchable resistor networks $RN_2$ includes a series circuit of a resistor $R_2$ and an electronic switch $SW_2$. The electronic switches $SW_1$ and $SW_2$ may be activated (switched on) and deactivated (switched off) via respective drive signals S1 and S2. The electronic switches $SW_1$ and $SW_2$ may be implemented as MOS transistors such as MOSFETs. However, any other type of electronic switch may also be applicable. In case of MOS transistors the drive signals S1 and S2 may be supplied to the gate electrodes of the MOS transistors.

When the first switchable resistor network $RN_1$ is activated, the voltage at the tuning input of the VCO 61 is pulled up towards the voltage $V_{REF1}$ (or $V_{DD}$) present at the first circuit node. Accordingly, the resistor network $RN_1$ operates substantially as a pull-up resistor. When the first switchable resistor network $RN_1$ is deactivated, it is substantially disconnected from the first circuit node and/or the tuning input of the VCO 61 and thus inactive. Similarly, when the second switchable resistor network $RN_2$ is activated, the voltage at the tuning input of the VCO 61 is pulled down towards the voltage $V_{REF2}$ (or $V_{VSS}$) present at the second circuit node. In this case, the resistor network $RN_2$ operates substantially as a pull-down resistor. When the switchable resistor network $RN_2$ is deactivated, it is substantially disconnected from the second circuit node and/or the tuning input of the VCO 61 and thus inactive. When both resistor networks $RN_1$ and $RN_2$ are activated, they basically form a voltage divider and the voltage at the tuning input of the VCO 61 is pulled towards a voltage value lying between the voltages $V_{REF1}$ and $V_{REF2}$ (or between $V_{DD}$ and $V_{SS}$). In the simple examples of FIGS. 6 and 7, the tuning voltage $v_{TUNE}(t)$ is set to $V_{DD} R_2/(R_1+R_2)+V_{SS}$ when both resistor networks $RN_1$ and $RN_2$ are active. The voltage $V_{DD} R_2/(R+R_2)+Vs$ s is denoted as $V_{REF3}$. Accordingly, three different voltage values may be generated at the tuning input of the VCO 61. If only the first resistor network $RN_1$ is active, the tuning voltage equals the first voltage ($v_{TUNE}(t)=V_{REF1}$ or $y_{TUNE}(t)=V_{DD}$). If only the second resistor network $RN_2$ is active, the tuning voltage equals the second voltage ($y_{TUNE}(t)=V_{REF2}$ or $v_{TUNE}(t)=V_{SS}$). If both resistor networks $RN_1$ and $RN_2$ are active, the tuning voltage equals the mentioned voltage $V_{REF3}$. If both resistor networks $RN_1$ and $RN_2$ are inactive, the voltage at the tuning input of the VCO 61 is floating and thus undefined.

To keep the noise power present at the tuning input of the VCO 61 low, the resistor networks $RN_1$ and $RN_2$ are configured to provide a comparably low resistance when activated. In one example, the resistances of the (active) resistor networks $RN_1$ and $RN_2$ are below 100 ohms. As the power of thermal noise (Johnson-Nyquist noise) is proportional to the resistance, noise at the tuning input is reduced and it decreases with decreasing resistance of the resistor networks $RN_1$ and $RN_2$. Accordingly, the resistor networks $RN_1$ and $RN_2$ are designed to have a resistance (when active) that is so low that the phase noise of the VCO due to thermal noise at the tuning input of the VCO is negligible as compared to the phase noise generated by the VCO due its intrinsic properties.

Figure 8:
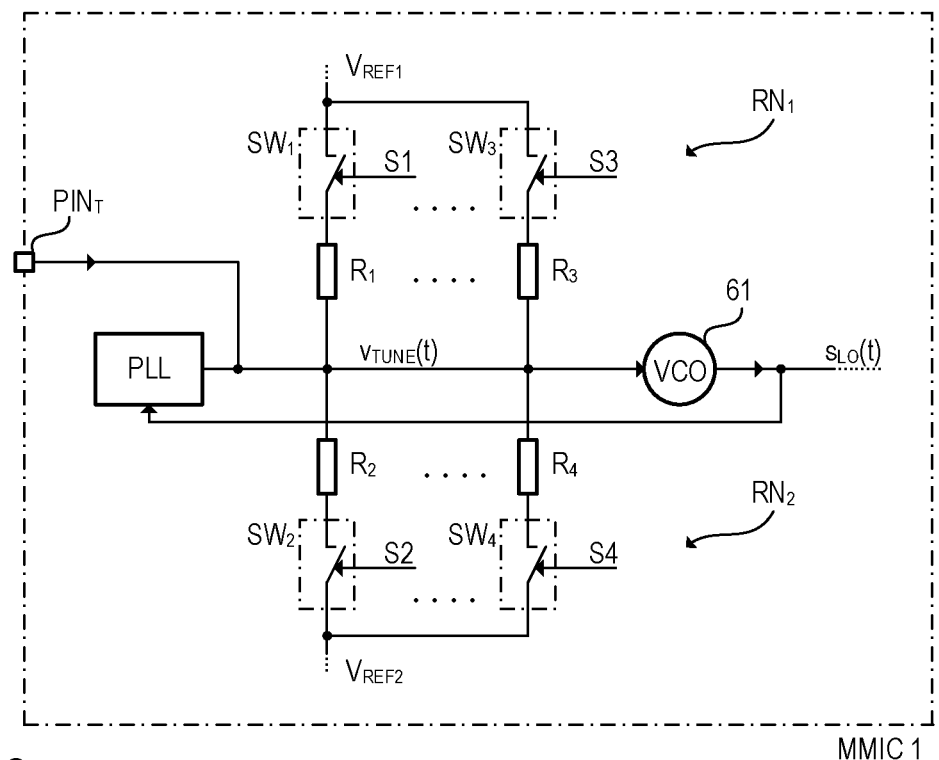
FIG. 8 is a diagram illustrating a further example of a circuit which may be used to set a tuning voltage of a VCO with low noise.

As shown in the example of FIG. 8, the switchable resistor networks $RN_1$ and $RN_2$ may include more than one resistor and more than one electronic switch. In the present example the first resistor network $RN_1$ includes two or more resistor-switch pairs $R_1$-$SW_1$, $R_3$-$SW_3$, etc., coupled in parallel. Similarly, the second resistor network $RN_2$ includes two or more resistor-switch pairs $R_2$-$SW_2$, $R_4$-$SW_4$, etc., coupled in parallel. If only the first switch $SW_1$ of the first resistor network $RN_1$ is active, the resistance of the first resistor network $RN_1$ is effectively the resistance of resistor $R_1$. If both switches $SW_1$ and $SW_3$ of the first resistor network $RN_1$ are active, the resistance of the first resistor network $RN_1$ is effectively half of the resistance of resistor $R_1$ (if $R_1=R_3$). For the second resistor network $RN_2$ the situation is effectively the same. The actual tuning voltage $v_{TUNE}(t)$ may be varied by selectively activating the switches $SW_1$, $SW_2$, $SW_3$, $SW_4$, etc. As compared to the previous example of FIG. 6, the present example of FIG. 8 allows not only activation and deactivation of the switchable resistor networks $RN_1$ and $RN_2$ but also to vary their effective resistance. Accordingly, the number of voltage levels that can be applied during the VCO testing is increased.

Figure 9:
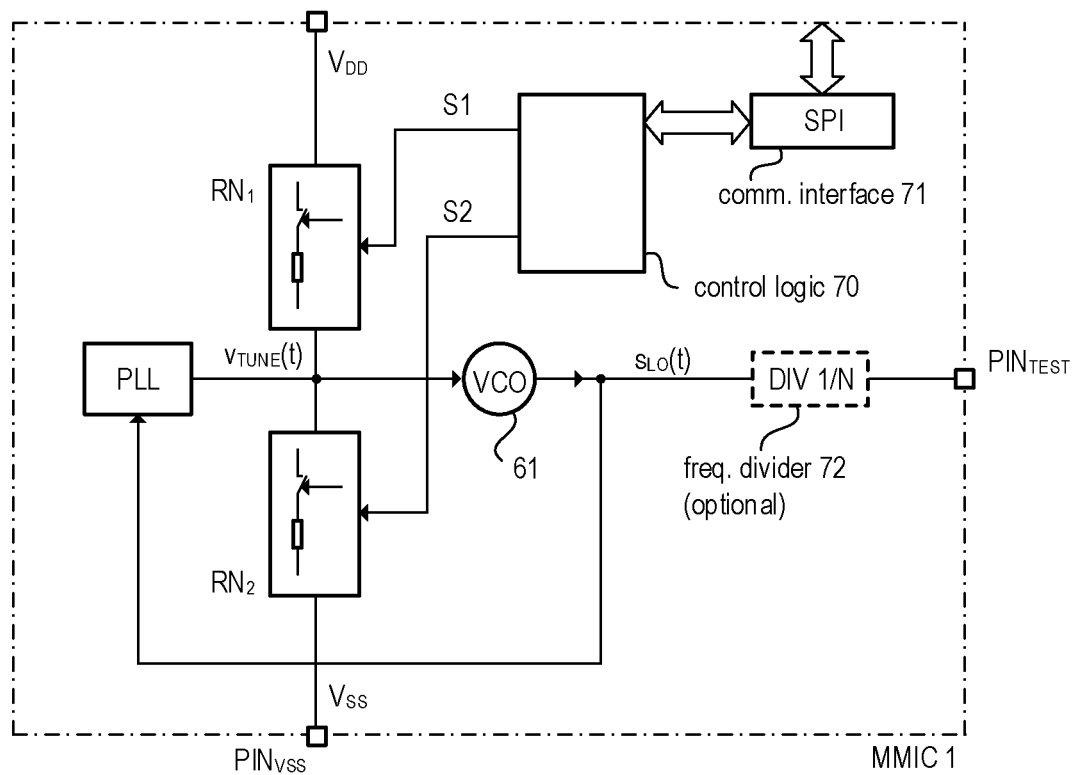
FIG. 9 is block diagram illustrating a portion of a radar MIMIC including circuitry that allows testing the VCO by an automatic test equipment (ATE).

In the example of FIG. 9, the first resistor network $RN_1$ and the second resistor network $RN_2$ are connected between the tuning input of the VCO 61 and the first circuit node and the second circuit node, respectively. As in FIG. 7, the first and the second circuit node are connected to the supply pins $PIN_{VDD}$ and $PIN_{VSS}$, respectively. The first and the second resistor network $RN_1$ and $RN_2$ receive the drive signals S1 and S2, respectively, and are configured to be selectively activated and deactivated by these drive signals S1 and S2. Further, the effective resistance of the first resistor network $RN_1$ and the second resistor network $RN_2$ may be set in accordance with the drive signals S1 and S2. Accordingly, the one or more switches included in the resistor networks $RN_1$ and $RN_2$ may be switched on and off in accordance with the drive signals S1 and S2.

As shown in FIG. 9, according to some embodiments, the MMIC 1 may include a control circuit 70 which may be a control logic and configured to generate the drive signals S1 and S2 in response to the reception of a control signal. The control signal may be received by the control circuit 70 from an external device via a communication interface 71, which is, in the embodiment of FIG. 9, a Serial Peripheral Bus (SPI) Interface. It is understood that any other known analog or digital communication interface may be applicable. The external device may be, for example, an automatic test equipment (ATE) which is usually employed during the mentioned EOL tests for testing the MMIC 1. The mentioned control signal may represent one or more control commands sent by the ATE to the control circuit 70 of the MMIC 1 via the communication interface 71. The information included in the control signal (e.g. in the one or more control commands) may be processed by the control circuit 70 to generate the drive signals S1 and S2. In other words, the information included in the control signal (e.g. generated by the ATE) represents the desired states of the resistor networks $RN_1$ and $RN_2$ and indicates to the control circuit 70, which of the resistor networks $RN_1$ and $RN_2$ are to be activated and, optionally, which effective resistance value is to be set for a specific resistor network. In one example embodiment, the control signal may include a digital word (i.e. a set of bits) which is decoded by the control circuit 70 and translated into appropriate signal levels of the drive signals S1, S2, etc.

In the example of FIG. 9, the MMIC 1 further includes a test contact, e.g. an output pin $PIN_{TEST}$, which is coupled to the RF output of the VCO either directly or via a frequency divider 72 or via a frequency multiplier 72'. Thus, the VCO output signal $s_{LO}(t)$ may be tapped at the test contact $PIN_{TEST}$, e.g., by the mentioned ATE. In an embodiment, in which a frequency divider 72 or a frequency multiplier 72' is coupled between the VCO 61 and the test contact $PIN_{TEST}$, a frequency-reduced or, respectively, a frequency-multiplied version of the VCO output signal $s_{LO}(t)$ is provided at the test contact $PIN_{TEST}$. This situation is also illustrated by the example block diagram of FIG. 10 that illustrates the signal flow between an ATE 2 and the MMIC 1 (e.g. as shown in FIG. 9) during a test such as an EOL test. According to FIG. 7, an ATE 2 may contact a MMIC 1 for executing a test routine. Thereby, the ATE provides supply voltages $V_{DD}$ and $V_{SS}$ by contacting the pins/contact pads $PIN_{VDD}$ and $PIN_{VSS}$ of the MMIC 1. Further, the ATE 2 establishes a communication link 3, which may be, e.g. an SPI bus connection, and taps the VCO output signal $s_{LO}(t)$ at the test contact $PIN_{TEST}$. During the test, the ATE may set different tuning voltages $v_{TUNE}(t)$ by generating an appropriate control signal sent via the communication link 3 to the MMIC 1 and tapping the resulting VCO output signal $s_{LO}(t)$ (which may be reduced in frequency when using the frequency divider 72 as shown in FIG. 9).

During the test, the ATE may process the VCO output signal $s_{LO}(t)$ in order to obtain information about the phase noise included therein. For this purpose, the ATE 2 may be configured to perform a spectral analysis of the output signal $s_{LO}(t)$ in order to obtain, for example, a power spectral density or similar characteristics of the phase noise.

Since the voltages for setting the operation point during testing are derived from internal supply voltages (see, e.g., FIG. 7, supply voltages $V_{DD}$ and $V_{SS}$), according to embodiments described herein, not only an external triggered testing of the VCO can be performed but also an internal testing such as, for example, during operation of the MMIC or before starting the operation of the MMIC. No modification in the hardware is needed in order to provide the voltages for setting the operation point of the VCO during external testing or internal testing. Furthermore, during both ways of testing the tuning voltage can be supplied with low noise thereby reducing the contribution of the tuning voltage noise to the phase noise generated by the VCO and thus enabling a better testing of the phase noise generated by the VCO.

Figure 10:
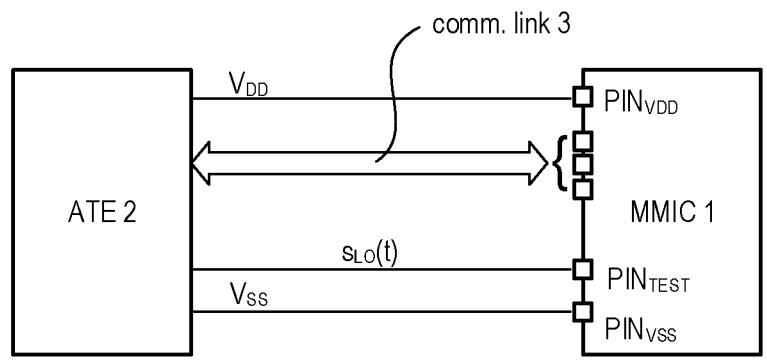
FIG. 10 is block diagram illustrating one example of how an ATE can connect to a MMIC during an EOL test.
Figure 11:
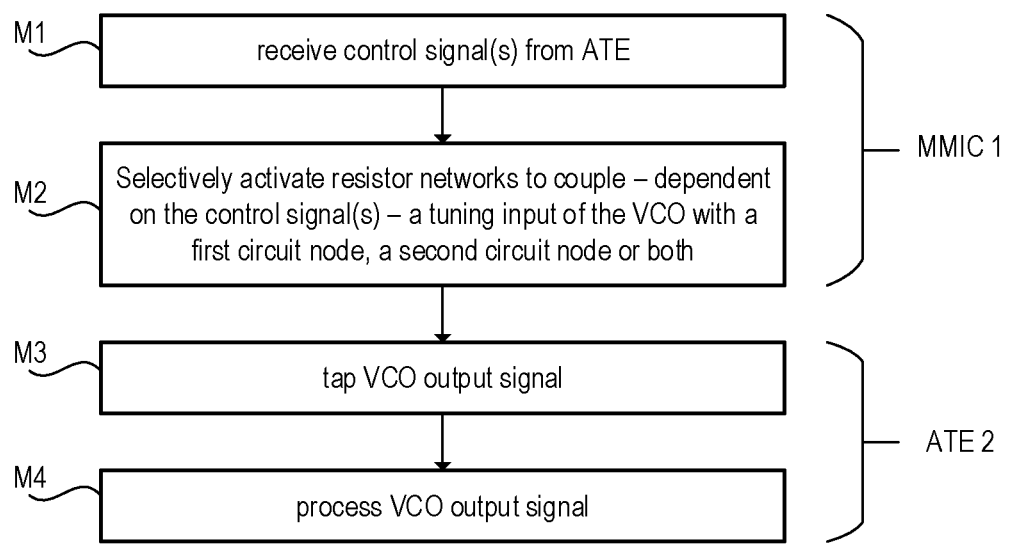
FIG. 11 is a flow chart illustrating one example method for testing the VCO of a radar MMIC.

FIG. 11 is a flow chart illustrating an example method in accordance with the herein-described concepts. The method may be performed, for example, by a MMIC and an ATE as illustrated in the examples of FIGS. 9 and 10. Accordingly, the MMIC receives a control signal (e.g. including one or more control commands) from the ATE during a test routine (see FIG. 11, step M1). Then, switchable resistor networks (see FIG. 9, resistor networks $RN_1$, $RN_2$) are selectively activated or deactivated based on the received control signal in order to couple the tuning input of the VCO to a first circuit node or a second circuit node or to both, the first and the second circuit node (see FIG. 11, step M2). Dependent on which one(s) of the resistor networks $RN_1$, $RN_2$ are activated the tuning voltage $v_{TUNE}(t)$ is set to specific value determined by the control signal. The ATE can then tap the VCO output signal $s_{LO}(t)$ (cf. FIG. 9), for example by contacting a test pin that is coupled to the VCO output (see FIG. 11, step M3). The ATE processes the VCO output signal (see FIG. 11, step M4) to obtain information indicating the performance of the VCO such as information about the phase noise characteristics of the VCO.

While the above embodiments have been described to include a VCO in a radar IC, it is to be noted that the same VCO testing design and concepts can be applied to any IC device having a VCO, e.g. wireless communication ICs etc.

While various embodiments have been described, it will be apparent to those of ordinary skill in the art that many more embodiments and implementations are possible within the scope of the description herein. Accordingly, the embodiments, described herein, are not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the example implementations illustrated herein.

What is claimed is:
1. An integrated circuit comprising:
a voltage controlled oscillator (VCO) configured to:
receive a tuning voltage at a tuning input, and
provide a radio frequency (RF) oscillator signal at an oscillator output;

a first switchable resistor network including a first resistor and a first switch and being connected between the tuning input of the VCO and a first node operably providing a first voltage;

a second switchable resistor network including a second resistor and a second switch and being connected between the tuning input of the VCO and a second node operably providing a second voltage;

a control circuit configured to activate, dependent on a control signal, at least one of the first switchable resistor network or the second switchable resistor network; and a loop filter,
wherein an input of the loop filter is an output signal of a phase detector of a phase locked loop,
wherein an output of the loop filter is used as the tuning input of the VCO, and
wherein the first switchable resistor network and the second switchable resistor network are connected in a path between the loop filter and the tuning input of the VCO.

2. The integrated circuit according to claim 1, wherein:
the phase locked loop includes:
the VCO, and
a feedback network connected to the tuning input of the VCO.

3. The integrated circuit according to claim 2, wherein the feedback network is configured to provide the tuning voltage to the VCO during operation of the phase locked loop, and
wherein, for testing the VCO, the tuning voltage and an operation point of the VCO are determined by the control signal based on whether the first switchable resistor network or the second switchable resistor network are selectively activated or deactivated dependent on the control signal.

4. The integrated circuit according to claim 1, wherein, in the first switchable resistor network, the first resistor and the first switch are connected in series; and
wherein, in the second switchable resistor network, the second resistor and the second switch are connected in series.

5. The integrated circuit according to claim 1, wherein the first switchable resistor network and the second switchable resistor network are configured to:
pull the tuning voltage towards the first voltage in a situation in which the first switchable resistor network is activated and the second switchable resistor network is deactivated,
pull the tuning voltage towards the second voltage in a situation in which the first switchable resistor network is deactivated and the second switchable resistor network is activated, or
pull the tuning voltage to a value between the first voltage and the second voltage in a situation in which both the first switchable resistor network and the second switchable resistor network are activated.

6. The integrated circuit according to claim 1, wherein the first node is coupled to a first supply node configured to receive a first supply voltage_as the first voltage.

7. The integrated circuit according to claim 6, wherein the second node is coupled to a second supply node configured to receive a second supply voltage_as the second voltage.

8. The integrated circuit according to claim 7, wherein the VCO is connected to the first supply node and the second supply node.

9. The integrated circuit according to claim 1, further comprising:

an external contact coupled to the oscillator output and configured to allow an external device to establish a connection with the VCO to tap the RF oscillator signal.

10. The integrated circuit according to claim 1, further comprising:
a frequency divider configured to reduce a frequency of the RF oscillator signal by a defined factor; and
an external contact coupled to the oscillator output via the frequency divider and configured to allow an external device to establish a connection with the frequency divider to tap a frequency-reduced RF oscillator signal.

11. The integrated circuit according to claim 1, further comprising:
a frequency multiplier configured to increase a frequency of the RF oscillator signal by a defined factor; and
an external contact coupled to the oscillator output via the frequency multiplier and configured to allow an external device to establish a connection with the frequency multiplier to tap a frequency-multiplied RF oscillator signal.

12. The integrated circuit according to claim 1, wherein the first switchable resistor network further comprises a third switch and a third resistor, and
wherein the second switchable resistor network further comprises a fourth switch and a fourth resistor.

13. A system, comprising:
an automatic test equipment (ATE) comprising a first communication interface and a test signal input; and
an integrated circuit comprising:
a second communication interface coupled to the first communication interface to receive a control signal from the ATE;
an external contact connected with the test signal input of the ATE;
a voltage controlled oscillator (VCO) configured to:
receive a tuning voltage at a tuning input, and
provide a radio frequency (RF) oscillator signal at an oscillator output,
the oscillator output being coupled with the external contact;
a first switchable resistor network including a first resistor and a first switch and being connected between the tuning input of the VCO and a first node operably providing a first voltage;
a second switchable resistor network including a second resistor and a second switch and being connected between the tuning input of the VCO and a second node operably providing a second voltage;
a control circuit configured to selectively activate, dependent on the control signal received by the second communication interface, at least one of the first switchable resistor network; or the second switchable resistor network; and
a loop filter,
wherein an input of the loop filter is an output signal of a phase detector of a phase locked loop,
wherein an output of the loop filter is used as the tuning input of the VCO, and
wherein the first switchable resistor network and the second switchable resistor network are connected in a path between the loop filter and the tuning input of the VCO.

14. The system of claim 13, wherein the oscillator output is coupled with the external contact via a frequency divider or via a frequency multiplier.

15. The system of claim 13, wherein the ATE is configured to set the tuning voltage of the VCO by selectively activating or deactivating at least one of the first switchable resistor network or the second switchable resistor network by transmitting the control signal to the integrated circuit.

16. The system of claim 13, wherein the ATE is configured to perform an analysis of the RF oscillator signal received via the test signal input.

17. A method comprising:
receiving, by an integrated circuit and from an automatic test equipment (ATE), a control signal,
the integrated circuit including:
a voltage controlled oscillator (VCO) configured to receive a tuning voltage at a tuning input, and
a loop filter,
wherein an input of the loop filter is an output signal of a phase detector of a phase locked loop, and
wherein an output of the loop filter is used as the tuning input of the VCO; and
selectively activating or deactivating, by the integrated circuit, at least one of a first switchable resistor network or a second switchable resistor network based on the control signal received from the ATE,
wherein the first switchable resistor network and the second switchable resistor network are connected in a path between the loop filter and the tuning input of the VCO,
wherein the first switchable resistor network includes a first resistor and a first switch and is connected between the tuning input of the VCO and a first node that provides a first voltage, and
wherein the second switchable resistor network includes a second resistor and a second switch and is connected between the tuning input of the VCO and a second node that provides a second voltage.

18. The method of claim 17, further comprising:
making a radio frequency (RF) oscillator signal, generated by the VCO in accordance with the tuning voltage at an external contact of the integrated circuit, available to be tapped by the ATE.

19. The method of claim 18, further comprising:
providing the RF oscillator signal to permit the ATE to determine information concerning a spectrum of or a phase noise included in the RF oscillator signal.

20. The method of claim 17, further comprising one of:
pulling the tuning voltage towards the first voltage in a situation in which the first switchable resistor network is activated and the second switchable resistor network is deactivated,
pulling the tuning voltage towards the second voltage in a situation in which the first switchable resistor network is deactivated and the second switchable resistor network is activated, or
pulling the tuning voltage to a value between the first voltage and the second voltage in a situation in which both the first switchable resistor network and the second switchable resistor network are activated.

* * * * *

UNITED STATES PATENT AND TRADEMARK OFFICE
CERTIFICATE OF CORRECTION

PATENT NO. : 10,673,442 B2
APPLICATION NO. : 16/203857
DATED : June 2, 2020
INVENTOR(S) : Philipp Franz Freidl et al.

Page 1 of 1

It is certified that error appears in the above-identified patent and that said Letters Patent is hereby corrected as shown below:

Claim 6:
Column 11, Line 59, change "receive a first supply voltage_as the first voltage." should be changed to
- receive a first supply voltage as the first voltage. -

Claim 7:
Column 11, Line 62, change "to receive a second supply voltage_as the second voltage." should be
changed to - to receive a second supply voltage as the second voltage. -

Signed and Sealed this
Seventeenth Day of November, 2020

Andrei Iancu
*Director of the United States Patent and Trademark Office*